United States Patent [19]
Garza et al.

[11] Patent Number: 6,078,738
[45] Date of Patent: Jun. 20, 2000

[54] COMPARING AERIAL IMAGE TO SEM OF PHOTORESIST OR SUBSTRATE PATTERN FOR MASKING PROCESS CHARACTERIZATION

[75] Inventors: Mario Garza; Keith K. Chao, both of San Jose, Calif.

[73] Assignee: LSI Logic Corporation, Milpitas, Calif.

[21] Appl. No.: 08/853,155

[22] Filed: May 8, 1997

[51] Int. Cl.⁷ .............................. G06F 17/50; G03F 9/00; G06K 9/03
[52] U.S. Cl. .......................... 395/500.22; 430/5; 430/30; 382/144; 438/16
[58] Field of Search ..................................... 364/488–491, 364/578; 378/35; 438/7, 16; 356/237; 382/144; 430/5, 30

[56] References Cited

U.S. PATENT DOCUMENTS

| | | | |
|---|---|---|---|
| 5,434,102 | 7/1995 | Watanabe et al. | 437/130 |
| 5,633,713 | 5/1997 | Tanaka et al. | 356/355 |
| 5,682,323 | 10/1997 | Pasch et al. | 364/491 |
| 5,725,973 | 3/1998 | Han et al. | 430/5 |
| 5,745,388 | 4/1998 | Mimotogi et al. | 364/578 |
| 5,795,688 | 8/1998 | Burdorf et al. | 430/30 |
| 5,801,954 | 9/1998 | Le et al. | 364/488 |
| 5,862,058 | 1/1999 | Samuels et al. | 364/491 |
| 5,879,844 | 3/1999 | Yamamoto et al. | 430/30 |

OTHER PUBLICATIONS

Maaike Op de Beeck et al., "Optical Proximity Effects and Correction Strategies for Chemical Amplified DUV Resists," SPIE vol. 2726, pp. 622–633, Mar. 13, 1996.

Grassmann et al. ("Aerial image studies of an advanced deep–UV exposure system", Microelectronic Engineering, vol. 23, No. 1–4, pp. 155–158, Jan. 1, 1994).

Hanawa et al. ("Fast and accurate optical proximity correction based on aerial image simulation", Proceedings of the SPIE—The International Society for Optical Engineering, vol. 2726, pp. 640–50, Jan. 1, 1996).

Bernard et al. ("Efficient computational techniques for aerial imaging simulation", Proceedings of the SPIE—The International Society for Optical Engineering, vol. 2726, pp. 273–287, Jan. 1, 1996).

(List continued on next page.)

Primary Examiner—Kevin J. Teska
Assistant Examiner—Phallaka Kik
Attorney, Agent, or Firm—Conley, Rose & Tayon, PC; B. Noel Kivlin

[57] ABSTRACT

A method of simulating a masking process in which a process simulator is used to produce an aerial image. The simulator is configured to receive input information. The input information includes a digital representation of a patterned mask and a data set. Each element of the data set corresponds to one of a plurality of parameters associated with the masking process. The simulator is configured to produce an aerial image based upon the input information. The aerial image represents the simulator estimation of a pattern that would be produced by the masking process using the patterned mask under conditions specified by the data set. The method further includes the step of supplying the input information to the simulator to produce the aerial image. A first data base is then generated from the aerial image. The first data base is a digital representation of the aerial image. Thereafter, the pattern is produced on a semiconductor substrate using the masking process and the patterned mask. The pattern is produced under the conditions specified by the data set. A second data base is then generated wherein the second data base is a digital representation of the actual pattern. The first data base and the second data base are then compared to produce an error data base. The error data base is indicative of differences between the aerial image and the pattern. Thereafter, the process simulator is modified based upon the error data base to minimize the differences between a successive iteration of the aerial image and the pattern.

13 Claims, 6 Drawing Sheets

OTHER PUBLICATIONS

Gehm et al. ("Proximity correction methodology using contemporary photolithography and topography simulators", Proceedings of the Microlithography Seminar INTERFACE '97, pp. 281–295, Jan. 1, 1997).

Pati et al. ("Exploiting Structure in Fast Aerial Image Computation for Integrated Circuit Patterns", IEEE Transactions on Semiconductor Manufacturing, vol. 10, No. 1, Feb. 1997, pp. 62–74).

COMPARING AERIAL IMAGE TO SEM OF PHOTORESIST OR SUBSTRATE PATTERN FOR MASKING PROCESS CHARACTERIZATION

BACKGROUND OF THE INVENTION

1. Field of the Invention

The present invention relates to the field of semiconductor processing and more particularly to a method of characterizing and improving a masking process by comparing an actual pattern produced with a masking process to a computerized image designed to estimate the pattern.

2. Description of the Related Art

Photolithographic and etch processes (collectively referred to as masking processes) are universally employed in semiconductor processing to fabricate patterns necessary to produce the various levels of a semiconductor process. In a typical photolithographic process, a photoresist layer is deposited upon a semiconductor substrate and exposed to an energy source in the presence of a patterned photo mask placed between the energy source and the photoresist layer. The patterned photo mask includes transparent and opaque areas for selectively exposing regions of a photoresist layer. Exposing portions of the photoresist layer alters the solubility of the exposed portions so that a subsequent developer step can selectively remove portions of the photoresist layer to produce a desired pattern. In a positive masking process, the initial photoresist layer is insoluble in the developer solution and the portions of the photoresist layer that are subsequently exposed to the energy source become soluble in the developer solution. In a negative resist process, the initial photoresist layer is soluble in the developer solution and the portions of the photoresist layer exposed to the energy source are altered to become insoluble. Thus, in a positive resist process, the patterned image remaining after the develop step comprises the unexposed portions of the photoresist layer while, in a negative resist process, the exposed portions remain after develop. Regardless of the type of photoresist used, the photolithography process is typically followed by an etch process during which the photoresist pattern is transferred to the underlying substrate by etching away the portions of the underlying substrate not covered or masked by the pr pattern. Etch processes for various substrate materials including doped and undoped silicon, doped and undoped silicon dioxide, silicon nitride, and various metal and refractive metals including aluminum, copper, tungsten, titanium, molybdenum, and alloys thereof are well known in the field of integrated circuit fabrication.

Ideally, the pr pattern produced by the photolithography process and the substrate pattern produced by the subsequent etch process would precisely duplicate the pattern on the photomask. For a variety of reasons, however, the pr pattern remaining after the resist develop step may vary from the pattern of the photomask significantly. Diffraction effects and variations in the photolithography process parameters typically result in critical dimension (CD) variation from line to line depending upon the line pitch (where pitch is defined for purposes of this disclosure as the displacement between an adjacent pair of interconnect lines). In addition to CD variation, fringing effects and other process variations can result in end-of-line effects (in which the terminal end of an interconnect line in the pattern is shortened or cut off by the photolithography process) and corner rounding (in which square angles in the photomask translate into rounded corners in the pattern). These three primary optical proximity effects, together with other photoresist phenomena such as notching, combine to undesirably produce a patterned photoresist layer that may vary significantly from the pattern of the photomask. In addition to variations introduced during the photolithography process, further variations and distortions are typically introduced during the subsequent etch process such that the pattern produced in the semiconductor substrate may vary from the photomask pattern even more than the pr pattern.

Conventional semiconductor process engineering in the areas of photolithography and etch typically includes controllably altering the process parameters associated with the various masking steps in an attempt to obtain a finished pattern that approximates the desired pattern as closely as possible. Among the parameters process engineers typically attempt to vary in an effort to produce a pr pattern substantially identical to the photomask pattern include the intensity, coherency and wave length of the energy source, the type of photoresist, the temperature at which the photoresist is heated prior to exposure (pre-bake), the dose (intensity x time) of the exposing energy, the numerical aperture (NA) of the lens used in the optical aligner, the use of antireflective coatings (ARC), the develop time, developer concentration, developer temperature, developer agitation method, post bake temperature, and a variety of other parameters associated with the photolithography process. Etch parameters subject to variation may include, for example, process pressure and temperature, concentration and composition of the etch species, and the application of a radio frequency energy field within the etch chamber. Despite their best efforts, however, semiconductor process engineers are typically unable to manipulate the photolithography and etch processes such that the photoresist and substrate patterns produced by the processes are substantially identical to the photomask pattern.

In an effort to compensate for the discrepancies between the pr pattern and the photo mask, optical proximity correction (OPC) techniques have been employed. In a typical optical proximity correction technique, features of a photomask pattern are distorted in an effort to anticipate various process effects to produce a final pr pattern that resembles the desired pattern. Because diffraction and other effects typically result in shrinking or rounding of lines and corners, the distortions typically take on the appearance of appendages to the extremities of the various features of a photomask pattern. While OPC techniques have been useful in improving the final appearance of pr patterns, OPC typically requires numerous iterations to produce a desired result. The cost associated with semiconductor photolithography processing equipment substantially precludes the dedication of a particular piece of equipment to experimentation necessary to characterize and optimize each photolithography mask and process.

To avoid the time and cost of producing actual test wafers for every desired permutation of process parameters, computerized simulation of masking processes is employed to facilitate the optimization of a particular masking sequence and the generation of an OPC distorted photomask. Masking process simulators receive various inputs corresponding to the parameters of the photoresist and etch processes to be simulated and attempt to simulate the pattern that will be produced by the specified masking process given a particular photomask. Process simulation also enables relatively inexpensive and quick comparison of various OPC techniques. Accordingly, computerized has significantly enhanced the process engineer's ability to characterize and optimize masking processes.

Nevertheless it is typically impossible to adequately account for the multitude of parameters associated with a masking process despite the enormous effort devoted to masking process characterization, the introduction of optical proximity correction techniques, and the emergence of sophisticated process simulation software. In other words, simulation programs are ultimately unable to account for the various parametric dependencies in a manner sufficient to predict the exact pattern that will be produced by any particular masking process and mask. Because it is desirable to be able to substantially produce a desired pattern in a masking process, it would be extremely beneficial to provide a method for improving the simulation software to accurately predict the final pattern produced by a masking process based upon actual results obtained using the masking process.

SUMMARY OF THE INVENTION

The problems identified above are in large part addressed by a method of simulating a masking process in which the differences between an aerial image produced by a software simulation routine and a pattern produced by an actual masking process are compared and the differences fed back to the simulation routine such that a successive iteration of the simulation software produces a better predicted result. The feedback of actual results to a simulation routine beneficially optimizes the simulation software to account for a variety of undetectable process dependencies.

Broadly speaking, the present invention contemplates a method of simulating a masking process in which a process simulator is used to produce an aerial image. The simulator is configured to receive input information. The input information includes a digital representation of a patterned mask and a data set. Each element of the data set corresponds to one of a plurality of parameters associated with the masking process. The simulator is configured to produce an aerial image based upon the input information. The aerial image represents the simulator estimation of a pattern that would be produced by the masking process using the patterned mask under conditions specified by the data set. The method further includes the step of supplying the input information to the simulator to produce the aerial image. A first data base is then generated from the aerial image. The first data base is a digital representation of the aerial image. Thereafter, the pattern is produced on a semiconductor substrate using the masking process and the patterned mask. The pattern is produced under the conditions specified by the data set. A second data base is then generated wherein the second data base is a digital representation of the actual pattern. The first data base and the second data base are then compared to produce an error data base. The error data base is indicative of differences between the aerial image and the pattern. Thereafter, the process simulator is modified based upon the error data base to minimize the differences between a successive iteration of the aerial image and the pattern.

In a presently preferred embodiment, the simulator includes a computer comprising a storage device, an input device, and a processor. The storage device is configured with computer instructions designed to generate the aerial image from the input information. The input device is adapted to receive the input information and store the input information in the storage device. The processor is coupled to the input device and the storage device and is capable of executing the computer instructions and storing the aerial image in the storage device. In alternative embodiments, the plurality of parameters associated with the masking process may include, among others, resist contrast ($\gamma$), resist thickness, resist sensitivity, resist solids content, resist viscosity, soft bake temperature, soft bake duration, exposure intensity, exposure duration, source wavelength, source coherency, develop time, developer concentration, developer temperature, developer agitation method, post bake temperature, post bake time, etch pressure, etch temperature, and etchant composition and concentration. The generation of the second data base is preferably accomplished by scanning the pattern with a scanning electron microscope to produce a scanned image and digitizing the scanned image to produce the second data base.

In one embodiment, the aerial image includes at least one alignment mark and the pattern includes corresponding alignment marks. In this embodiment, the comparison of the first data base with the second data base is facilitated by superimposing the alignment mark of the aerial image with the corresponding alignment mark of the pattern. The process of producing the pattern, in one embodiment, includes spin depositing a photoresist layer on an upper surface of the semiconductor substrate, selectively exposing portions of the photoresist layer, and applying developer to the selectively exposed photoresist layer. The selective exposure of the photoresist layer results in exposed portions and unexposed portions. A solubility of the exposed portions in a developer solution is unequal to a solubility of unexposed portions of the developer solution. In a positive resist embodiment of the masking process, and exposed portions of the photoresist layer become soluble in the developer solution. In a negative resist embodiment, the photoresist layer is initially soluble in a developer solution and the exposed portions of the photoresist layer become insoluble in the developer solution.

The optical energy source associated with the masking process suitably includes a mercury vapor lamp. A bottom antireflective coating (BARC) layer may be deposited prior to the selective exposure of the photoresist layer. In another embodiment, a top antireflective coating (TARC) may be deposited on the photoresist layer prior to the selective exposure. In one presently preferred embodiment, the patterned mask includes features that are distorted by an OPC routine.

The present invention further contemplates an optimization/characterization system that includes a process simulator, photolithography equipment, a scanning device, and a comparator. The process simulator is configured to receive input information including a digital representation of a patterned mask and a data set wherein each element of the data set corresponds to one of a plurality of parameters associated with the masking process. The simulator us further configured to produce an aerial image based upon the input information. The aerial image represents the simulator's estimation of a pattern that would be produced by the masking process using the pattern mask under conditions specified by the data set. The photolithography equipment of the system produces the pattern on a semiconductor substrate. Photolithography equipment typically associated with the pattern include, but is not limited to, spin/develop tracks and optical aligners. The system further includes a scanning device such as a scanning electron microscope to produce a scanned image from the pattern. The comparator compares the aerial image with the scanned image to produce an error data base indicative of differences between the aerial image and the pattern. In one presently preferred embodiment, the comparator includes means for digitizing the aerial image and the scanned image such that the images may be compared on an appropriately configured computer.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 1:
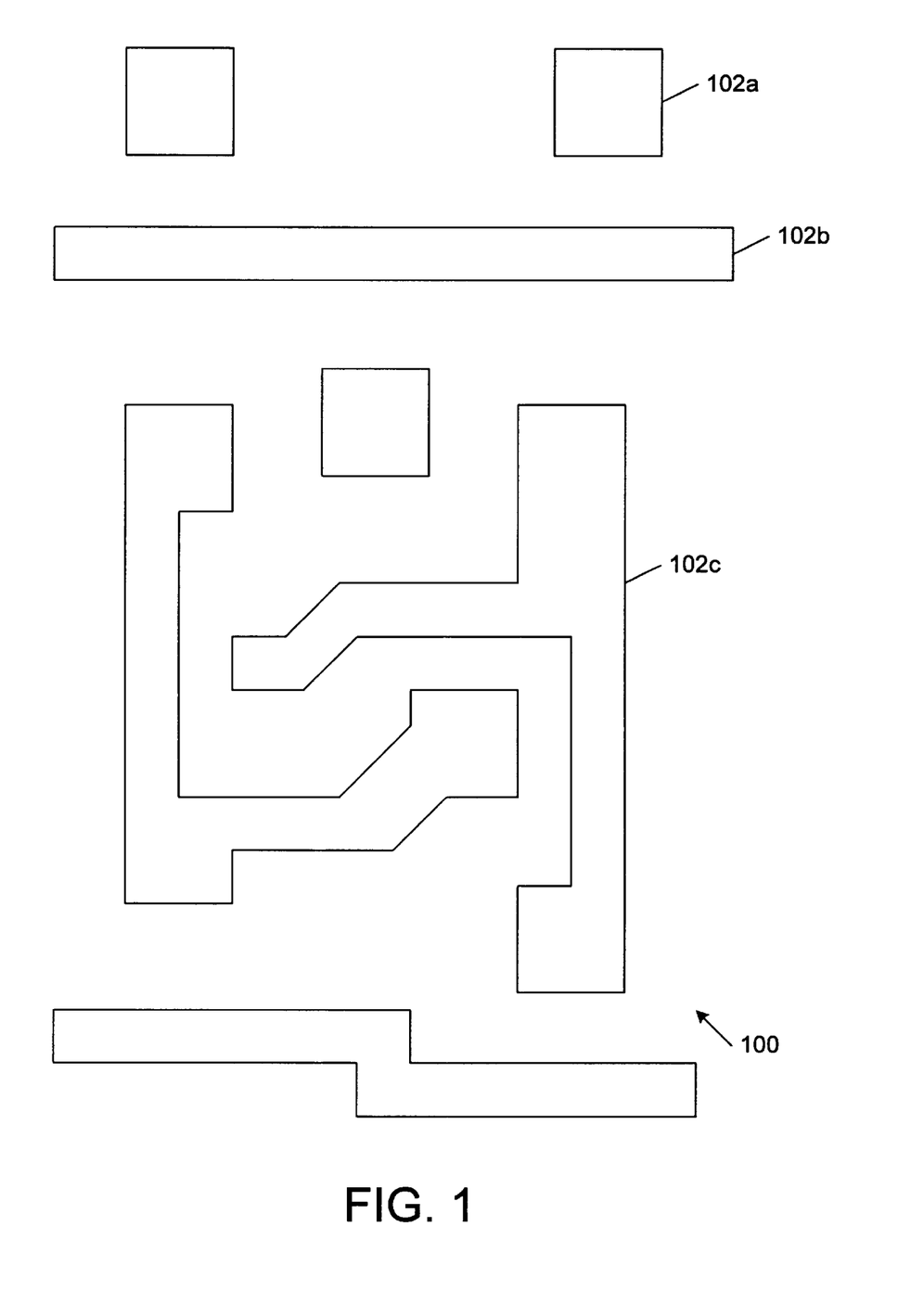
FIG. 1 is a partial top view of a desired pattern to be produced by a semiconductor masking process.

Turning now to FIG. 1 a desired semiconductor pattern 100 is shown. Semiconductor pattern 100 includes various pattern elements 102a, 102b, and 102c (collectively referred to as pattern elements 102). As will be appreciated by those skilled in the art of semiconductor processing and design, elements 102 of semiconductor pattern 100 includes various interconnect sections and pattern elements designed to achieve a desired function when the integrated circuit contemplated by the semiconductor fabrication process is completed. As shown in FIG. 1, typical elements 102 of a semiconductor pattern 100 are substantially comprised of straight lines and square corners. For a variety of reasons, reproducing the exact image of semiconductor pattern 100 in a production process is extremely complicated due to the large number of parameters associated with typical masking processes and further due to the unavoidable diffraction effects which inevitably result in some variations between the photomask used to the produce a pattern and the pattern itself. As previously described, a dedicated process engineering effort is capable of reducing, but not eliminating, variations between the photomask and the actual pattern produced by the process. Typically, optical effects associated with photolithography processes result in, among other effects, a line width dependence upon line width pitch, rounding of the corners, and end-of-line effects which result in shortening of terminal portions of various features 102 of pattern 100. To address optical proximity effects such as those just described, OPC techniques are used to fabricate a mask which include intentionally embedded distortions of the various features 102 of the pattern 100.

Figure 2:
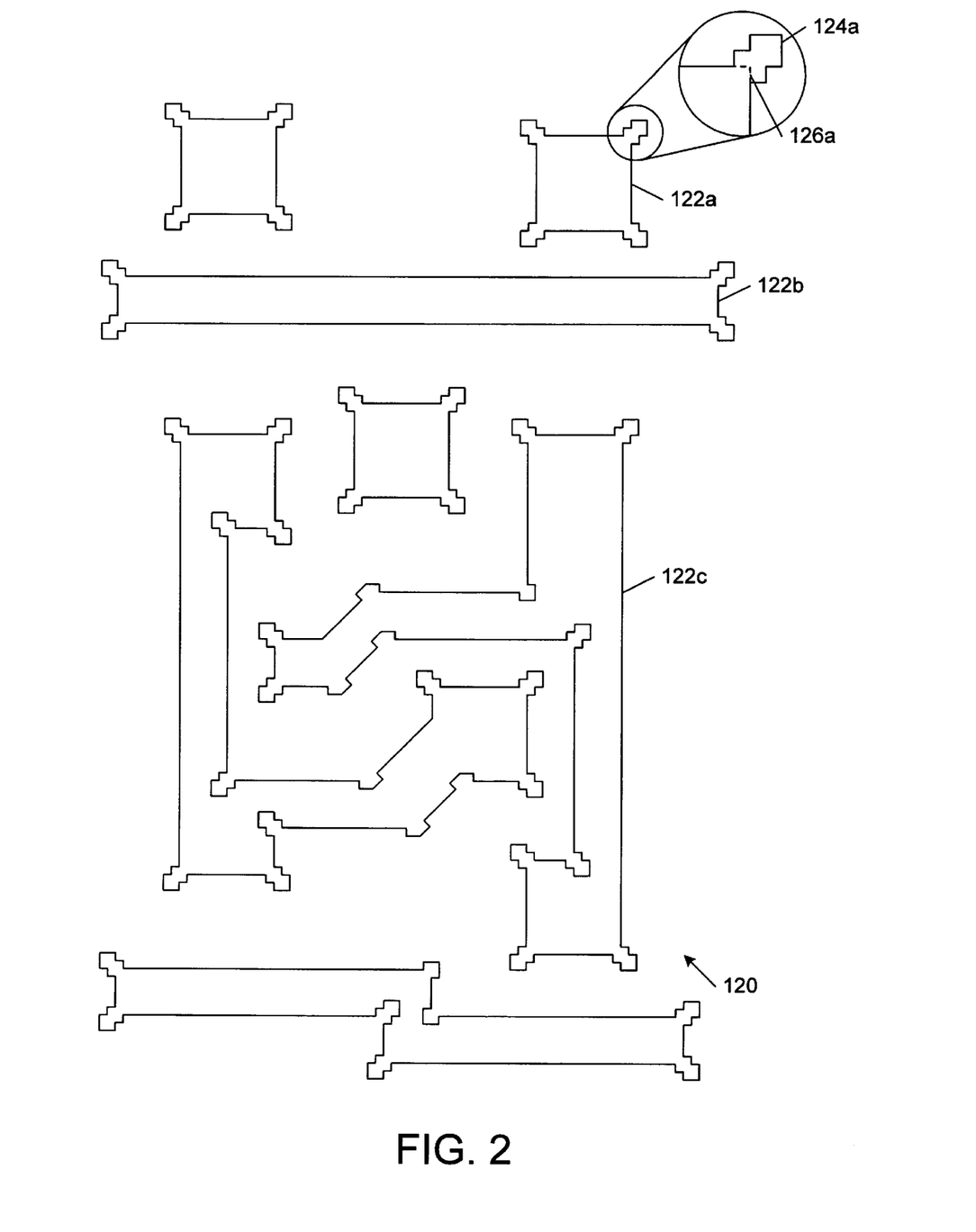
FIG. 2 is a partial top view, including optical proximity correction distortions, of a patterned photo mask used to produce the pattern of FIG. 1.

Turning to FIG. 2, a portion of an OPC distorted photomask is shown. Photomask 120 includes various features 122 (including feature 122a, 122b, 122c and so on) wherein each of the photomask features 122 corresponds to a feature 102 of semiconductor pattern 100 as shown in FIG. 1. In addition, each photomask feature 122 of photomask 120 may include optimal proximity correction distortion. An example of an OPC distortion 124a is shown in the exploded view of FIG. 2. OPC distortion 124a is typically a computer generated distortion of various terminal or peripheral features of the corresponding mask element 102 designed to anticipate diffraction effects associated with the semiconductor process. OPC software packages are commercially available from vendors such as PRECIM and, in some cases, are capable of multiple correction modes. Ideally, production of a pattern using the OPC distorted photomask 120 as shown in FIG. 2 results in a pattern which exactly duplicates the semiconductor pattern 100 of FIG. 1. Unfortunately, OPC techniques typically do not result in the production of a pattern that is a perfect replica of the desired semiconductor pattern.

Figure 3:
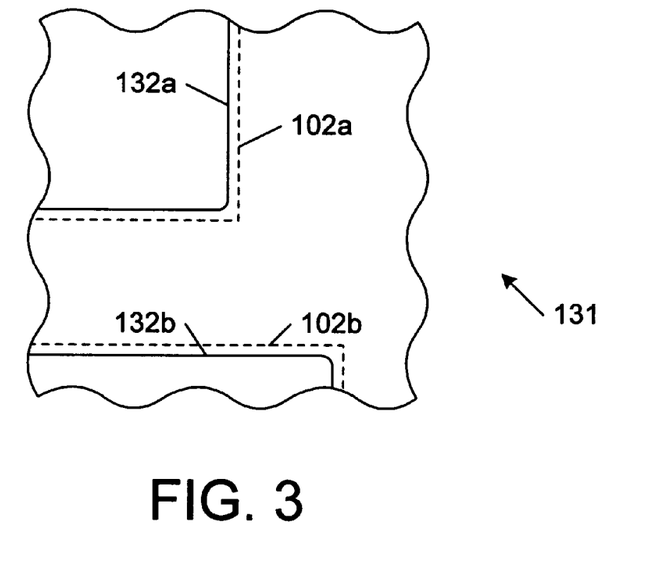
FIG. 3 is a detailed view of a portion of FIG. 2 showing discrepancies between an actual pattern and a desired pattern.

Turning now to FIG. 3, a portion of a patterned layer 131 (which includes varous features 132a and 132b) is shown. It is to be understood that patterned layer 131 may cmprise, in alternative embodiments, a photoresist pattern produced by a photolithography process or a substrate pattern produced by an etch process. FIG. 3 also shows, in dashed lines, an overlay of the desired semiconductor pattern 100. It is seen in FIG. 3 that the actual pattern 131 produced by a masking process varies from the desired semiconductor pattern 100. This discrepancy is shown in FIG. 3 as the displacement between the dashed lines of semiconductor elements 102a and 102b and the actual pattern elements 132a and 132b. Typically, the variations from the idealized pattern 100 include rounding of the corners and a shrinking of the line widths. It will be appreciated to those skilled in the art of semiconductor processing that variations from the desired semiconductor pattern can contribute to lower processing yields, reduced reliability, reduced tolerance to subsequent misalignment, and other undesired effects.

Process simulation software such as Depict version 3.1.2 available from TMA is capable of producing a simulated estimate of the pattern that would be produced by a specified masking process using a given photomask. Masking process simulators are useful for generating a large quantity of information concerning the effects of modifying various parameters associated with the process. Simulation is necessary to avoid the time and expense associated with producing actual test wafers for each proposed parameter modification.

Figure 4:
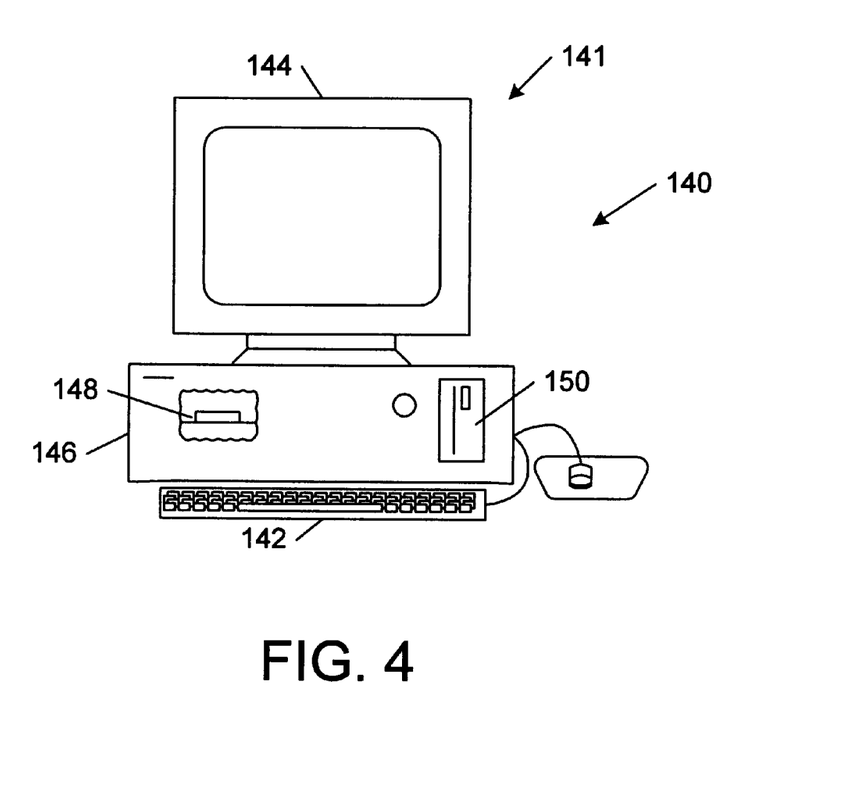
FIG. 4 is a prospective view of a computer used for simulating a semiconductor process.

Turning to FIG. 4, an exemplary embodiment of a process simulator 140 is shown. Simulator 140 is configured to receive input information and further configured to produce an aerial image based on and in response to the input information. The input information, in the presently preferred embodiment, includes a data set and a digital representation of a patterned mask such as patterned mask 120 shown in FIG. 2. Each element of the data set corresponds to a parameter associated with the masking process to be simulated. The parameters that may be associated with simulator 140 will be discussed in greater detail below with respect to FIG. 5. An aerial image refers to the simulator's estimation of the pattern that would be produced using the patterned mask with the masking process being simulated under conditions specified by the data set. In the embodiment shown in FIG. 4, simulator 140 comprises a computer 141. Computer 141 includes a storage device (not shown in the drawing) configured with computer instructions designed to generate the aerial image from the input information. Computer 141 further includes an input device for receiving the input information and for storing the input information in the storage device. A suitable input device may include, for example, disk drive 50 adapted to receive a disk containing a digital representation of the data set and the patterned mask. Alternatively, an input device may include, for example, keyboard 142. Computer 141 further includes a processor 148 coupled to input device 150 and the storage device. Processor 148 executes the computer instructions stored in the storage device using the input information to produce the aerial image and store the aerial image in the storage device. Once the aerial image is appropriately stored in the storage device, it may be output in the form of a visual display using monitor 144 or output in some other usable format such as a hard copy produced by a computer printer or a disk containing a digital representation of the aerial image. Masking process simulation software such as Depict from TMA is known in the art.

Figure 5A:
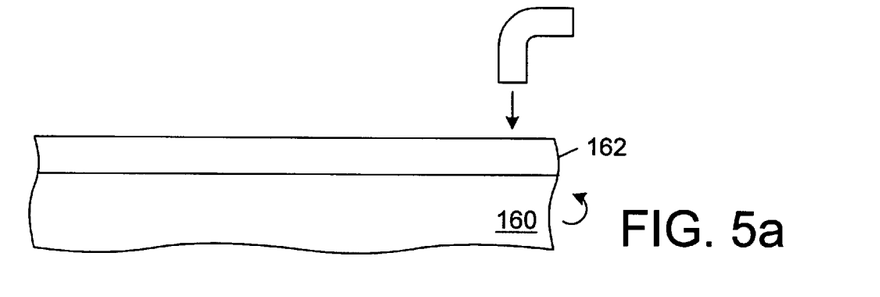
FIG. 5a, 5b and 5c are a sequence of partial cross-sectional views of a semiconductor wafer upon which a patterned photoresist layer is formed.
Figure 5B:
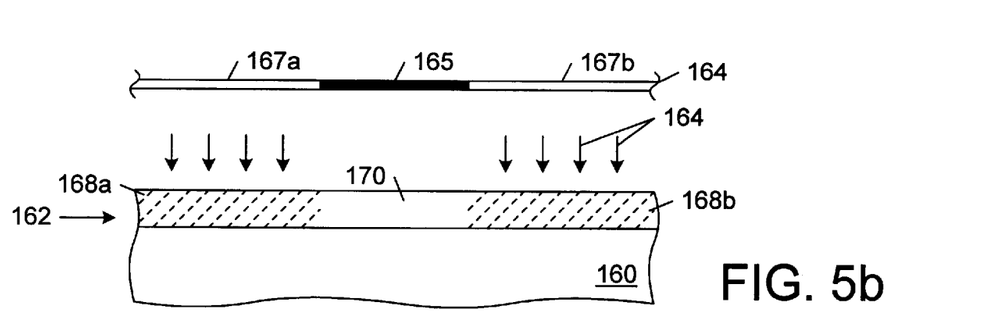
Figure 6:
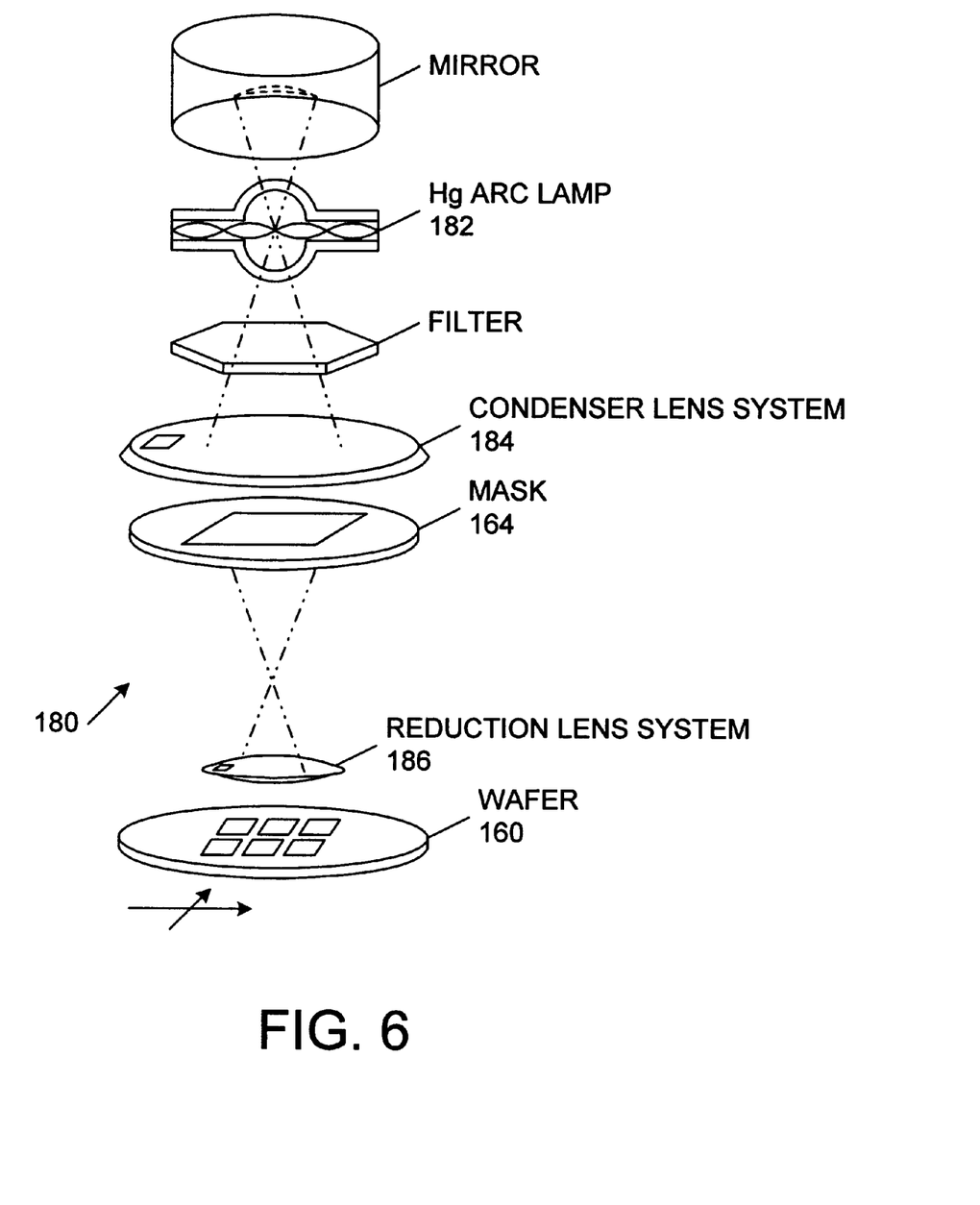
FIG. 6 an exploded view of selected elements of an optical aligner.

Turning now to FIGS. 5 and 6, a typical photoresist process and optical aligner are depicted to illustrate the variety of parameters that may be incorporated into simulator 140. FIG. 5a is a partial cross-sectional view of a semiconductor substrate 160 upon which a photoresist layer 162 has been deposited. Semiconductor substrate 160 typically includes a single crystal silicon bulk upon which one or more semiconductor process layers have been fabricated. The material upon which photoresist layer 162 is deposited may include, among others, silicon, a dielectric such as silicon-oxide, a metal such as aluminum or an aluminum alloy, silicon nitride, and a variety of other materials typically associated with semiconductor processing. A suitable method of depositing photoresist layer 162 upon semiconductor substrate 160 includes a conventional spin deposition technique in which the photoresist layer is applied to the semiconductor substrate as a liquid while the substrate is rotating to produce a substantially uniform thickness photoresist layer across the surface of semiconductor substrate 160. Spin deposition techniques are well known in the field of semiconductor processing. After deposition of the photoresist layer 162, a typical pr process includes a soft bake during which the photoresist layer is heated to improve the adhesion between the photoresist layer and the semiconductor substrate and to drive off a liquid portion of the photoresist. The soft bake or pre-bake process may be varied according to different temperatures and durations to achieve various resist consistencies prior to exposure. FIG. 5b shows a simplified view of an exposure process during which optical energy 166 is directed at photoresist layer 162 through photomask 164 to selectively expose regions 168a and 168b of photoresist layer 162. As seen in FIG. 5b, photomask 164 includes opaque region 165 and transparent regions 167a and 167b. Opaque regions 165 of photomask 164 are suitably comprised of a reflective material such as chrome. Transparent regions 167 of photomask 164 are suitably composed of clear material such as fused quartz. The opaque regions and transparent regions of photomask 164 result in unexposed portions 170 and exposed portions 168 of photoresist layer 162 when optical energy 166 is directed at semiconductor substrate 160 in the presence of photomask 164. As is well known, the solubility of exposed portions 168 in a developer solution is either less than or greater than a solubility of unexposed portion 170 in the developer solution depending upon the type of photoresist. In a positive resist application, photoresist layer 162 is initially insoluble in a developer solution. After exposure, the exposed portions of photoresist layer 162 have a greater solubility in the developer solution such that application of a developer solution removes the exposed portions of photoresist layer 162 without substantially effecting unexposed portions 170. In a negative resist application, the initial photoresist layer 162 is soluble in the developer solution. In this application, exposed portions 168 of photoresist layer 162 have a greater solubility than unexposed portions 170 in the developer solution. Application of a developer solution to a negative resist after exposure results in the removal of unexposed portions 170. It will be appreciated to those skilled in the art that different developer solutions are used in positive resist applications and negative resist applications. The exposure process shown in FIG. 5b comprises a number of parameters that may be accommodated by the simulator 140. The exposure, duration and intensity of optical energy 166 coupled with the coherency and wavelength of the impinging energy may be suitably incorporated into simulator 140. In addition, the photoresist itself can have a significant impact on the resulting profile. As is well known to those skilled in the field of photolithography engineering, resist contrast ($\gamma$), resist thickness, resist sensitivity, resist solids content, and resist viscosity can all affect the resulting profile and may all be incorporated into the simulator.

Figure 5C:
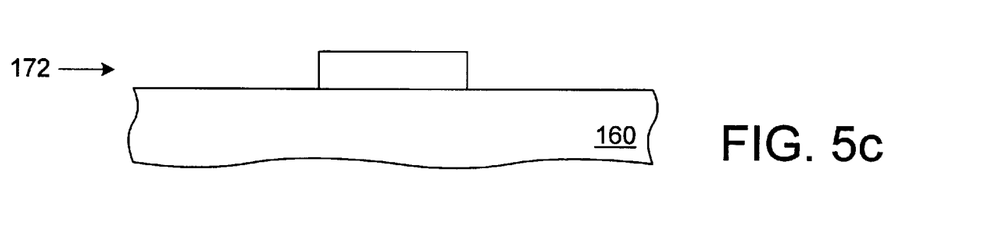

Turning to FIG. 5c, a subsequent processing step is shown in which exposed portions 168 of photoresist layer 162 have been removed with a develop process to produce a pattern 172 upon semiconductor substrate 160. It will be further appreciated to those skilled in the art that the developer process and the etch process (not shown in the drawing) both include a number of parameters potentially available to the simulation routine. Develop time, developer concentration, developer temperature, developer agitation method, and any post bake time and temperature may affect the resulting profile accordingly. Etch parameters may include, as examples, etch temperature, etch pressure, and etchant composition and concentration. The process parameters mentioned in the preceding discussion are meant to be illustrative rather than exhaustive and additional parameters may be incorporated into the simulator 140.

Turning now to FIG. 6, key components of an optical aligner 180 are shown including a mercury arc lamp 182, a first lens 184, and, in a reduction lens system, a reduction lens 186. Energy from mercury lamp 182 is directed toward mask 164 through lens 184 and onto semiconductor substrate 160 through reduction lens 186. As noted previously, the resist image obtained may be effected by the intensity of mercury lamp 182, the duration of the exposure, the coherency of the optical energy, the numerical aperture of lens 184 and 186, and the wavelength of the mercury lamp source. The parameters associated with optical aligner 180, may, like the parameters associated with the other features of the masking process, be incorporated into simulator 140.

It is theorized that, ultimately, the simulator will produce an estimate of the pattern (the aerial image) that varies from the actual pattern produced by the masking process regardless of the number of parameters incorporated into simulator 140. Accordingly, it is the intention of the present invention to introduce a feedback mechanism into the simulation process whereby the discrepancies observed between the actual pattern and the aerial image are analyzed to produce a modified simulator that results in less discrepancy or error between the aerial image produced during a successive iteration of the simulator and the actual image produced by the pattern.

Figure 7:
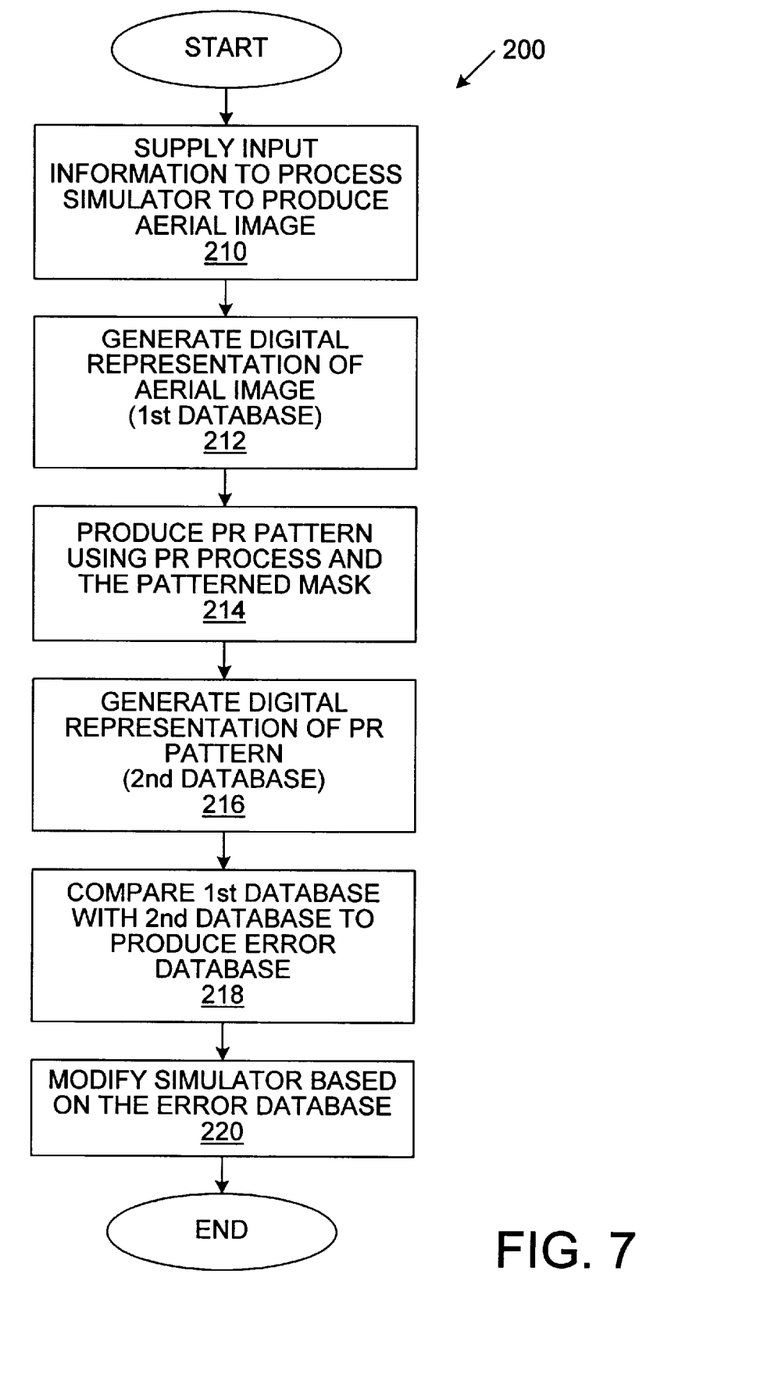
FIG. 7 is a flow diagram of a method used according to the present invention for improving the simulation of a masking process.

Turning now to FIG. 7, a process flow 200 is shown in accordance with the present invention. Process 200 contemplates a first step 210 during which input information is supplied to process simulator 140 to produce an aerial image. The input information, as discussed previously, includes a data set corresponding to the various parameters of a simulated masking process and a digital representation of a patterned mask. The aerial image represents the simulator's estimation of a pattern that would be produced by the masking process using the pattern mask under the conditions specified by the data set. After the aerial image has been produced, a digital representation of the aerial image is generated as indicated in step 212 of FIG. 7. For purposes of this disclosure, the digital representation of the aerial image is referred to herein as the first data base. In process step 214, a pattern is produced using the masking process being simulated by simulator 140 in process step 210 under the conditions specified by the data set which is input to simulator 140. Thereafter, a digital representation of the pattern is generated in process step 216. In a presently preferred embodiment, the generation of a digital representation of the actual pattern is facilitated with a scanning electron microscope. A scanning electron microscope (SEM) image of the pattern is produced according to techniques well known in the semiconductor processing field. Thereafter, the SEM image is digitized to produce a second data base. In one presently preferred embodiment, the aerial image and the pattern 172 may include corresponding alignment marks to facilitate a subsequent comparison of the pattern 172 and the aerial image. In process step 218, the first data base is compared with the second data base to produce an error data base. The error data base is a digital representation of variations and discrepancies between the aerial image and pattern 172 produced by the actual masking process. This error data base gives invaluable insight into the deficiencies of the simulation model. The variations between the aerial image and the pattern photoresist layer reflect parametric effects and interdependencies of the masking process that are difficult if not impossible to anticipate a priori. Empirically obtained data, on the other hand, gives immediate and accurate feedback into modifications that are required to be made in the simulation routine to more accurately reflect the intricacies of the masking process. It is contemplated that a statistician, a mathematician, or other skilled person knowledgeable in the field of process simulation and familiar with the photoresist simulation routine employed by simulator 140 will be able to beneficially modify simulator 140 with the assistance of a skilled software engineer based on the information contained in the error data base to produce a modified simulation routine which more accurately predicts and simulates the pattern such that a subsequently executed iteration of simulator 140 produces a modified aerial image that more accurately approximates pattern 172 than the original aerial image.

Numerous variations and modifications will become apparent to those skilled in the art once the above disclosure is fully appreciated. It is intended that the following claims be interpreted to embrace all such variations and modifications.

What is claimed is:

1. In the field of semiconductor processing, a method of simulating a masking process, comprising:

providing a process simulator, wherein said simulator is configured to receive input information comprising a digital representation of a patterned mask and a data set wherein each element of said data set corresponds to one of a plurality of parameters associated with said masking process, said simulator further configured to produce an aerial image based upon said input information, wherein said aerial image represents said simulator's estimation of a pattern that would be produced by said masking process using said patterned mask under conditions specified by said data set;

supplying said input information to said simulator to produce said aerial image, generating a first database comprising a digital representation of said aerial image;

producing said pattern on a semiconductor substrate using said masking process and said patterned mask under the conditions specified by said data set;

generating a second database comprising a digital representation of said pattern;

comparing said first database with said second database to produce an error database indicative of differences between said aerial image and said pattern; and modifying said process simulator based upon said error database to minimize said differences between a successive iteration of said aerial image and said pattern.

2. The method of claim 1, wherein said simulator comprises a computer, said computer including:

a storage device, wherein said storage device is configured with computer instructions designed to generate, upon execution, said aerial image from said input information;

an input device for receiving said input information and for storing said input information in said storage device; and a processor coupled to said input device and said storage device, for executing said computer instructions and storing said aerial image in said storage device.

3. The method of claim 1, wherein said plurality of parameters associated with said masking process include parameters selected from the group consisting of at least one of resist contrast ($\gamma$), resist thickness, resist sensitivity, resist solids content, resist viscosity, soft bake temperature, soft bake duration, exposure intensity, exposure duration, source wavelength, source coherency, develop time, developer concentration, developer temperature, developer agitation method, post-bake temperature, post-bake time, etch pressure, etch temperature, etchant composition, and etchant concentration.

4. The method of claim 1, wherein the step of generating said second database comprises:

scanning said pattern with a scanning electron microscope to produce a scanned image; and digitizing said scanned image to produce said second database.

5. The method of claim 1, wherein said aerial image includes an alignment mark and said pattern includes a corresponding alignment mark and wherein the step of comparing said first database with said second database is facilitated by superimposing said alignment mark of said aerial image with said corresponding said alignment mark of said pattern.

6. The method of claim 1, wherein the step of producing said pattern comprises:

spin depositing a photoresist layer on an upper surface of the semiconductor substrate;

selectively exposing portions of said photoresist layer by directing an optical energy source at said photoresist layer through said patterned mask to form exposed portions and unexposed portions of said photoresist layer, wherein a solubility of said exposed portion in a developer solution is unequal to a solubility of said unexposed portion in said developer solution;

applying said developer to said photoresist layer to remove said portions of said photoresist layer with a greater solubility in said developer solution.

7. The method of claim 6, wherein said photoresist layer is initially insoluble in a developer solution, and further wherein said photoresist layer becomes soluble in said developer solution if said photoresist layer is exposed to an optical energy source.

8. The method of claim 6, wherein said photoresist layer is initially soluble in a developer solution, and further wherein said photoresist layer becomes soluble in said developer solution if said photoresist layer is exposed to an optical energy source.

9. The method of claim 6, wherein said optical energy source comprises a mercury vapor lamp.

10. The method of claim 6 further comprising, prior to the step of selectively exposing said photoresist layer, depositing a bottom antireflective coating.

11. The method of claim 6 further comprising after the step of spin depositing said photoresist layer and prior to the step of selectively exposing said portions, depositing a top antireflective coating.

12. The method of claim 6, further comprising etching portions of said semiconductor substrate not masked by said pattern to reproduce said pattern in said semiconductor substrate.

13. The method of claim 1, wherein said patterned mask comprises features distorted by an optimal proximity correction routine.

* * * * *